United States Patent
Baisl et al.

(10) Patent No.: US 10,043,988 B2
(45) Date of Patent: Aug. 7, 2018

(54) ELEMENT FOR STABILIZING AN OPTOELECTRONIC DEVICE METHOD FOR PRODUCING AN ELEMENT AND OPTOELECTRONIC DEVICE

(71) Applicant: OSRAM OLED GmbH, Regensburg (DE)

(72) Inventors: Richard Baisl, Regensburg (DE); Andrew Ingle, Allershausen (DE); Erwin Lang, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 230 days.

(21) Appl. No.: 14/442,397

(22) PCT Filed: Nov. 11, 2013

(86) PCT No.: PCT/EP2013/073489
§ 371 (c)(1),
(2) Date: May 12, 2015

(87) PCT Pub. No.: WO2014/072502
PCT Pub. Date: May 15, 2014

(65) Prior Publication Data
US 2016/0276605 A1 Sep. 22, 2016

(30) Foreign Application Priority Data
Nov. 12, 2012 (DE) .................. 10 2012 220 586

(51) Int. Cl.
*H01L 51/00* (2006.01)
*C03C 17/22* (2006.01)
(Continued)

(52) U.S. Cl.
CPC .......... *H01L 51/0097* (2013.01); *C03C 17/22* (2013.01); *H01L 51/448* (2013.01);
(Continued)

(58) Field of Classification Search
CPC .......... H01L 2251/568; H01L 51/0097; H01L 51/448; H01L 51/5253; H01L 51/56
See application file for complete search history.

(56) References Cited

U.S. PATENT DOCUMENTS 4,451,119 A * 5/1984 Meyers ................ G02B 5/0858
359/846
4,863,773 A * 9/1989 Rousseau .............. C04B 35/806
428/68

(Continued)

FOREIGN PATENT DOCUMENTS

DE 102008048472 A1 3/2010
DE 102011006321 A1 10/2012
(Continued)

*Primary Examiner* — Caridad Everhart
*Assistant Examiner* — Ankush Singal
(74) *Attorney, Agent, or Firm* — McDermott Will & Emery LLP (57) ABSTRACT

An element (1) is provided for stabilising an optoelectronic device (7), wherein the element (1) comprises a main body (1C), wherein the main body (1C) consists of a glass or at least comprises a glass and wherein the main body (1C) comprises a first and a second surface (1A, 1B). The first and second surface (1A, 1B) are opposite to one another and extend in each case in a lateral main direction of extension of the element (1), wherein a protective layer (2A, 2B) is formed at least at one of the surfaces (1A, 1B) and wherein the protective layer (2A, 2B) is configured and arranged in such a way that cracks (3) present in the main body (1C) are filled in by a material of the protective layer (2A, 2B). In addition, an optoelectronic device (7) is provided.

18 Claims, 2 Drawing Sheets

(51) Int. Cl.
  *H01L 51/44* (2006.01)
  *H01L 51/52* (2006.01)
  *H01L 51/56* (2006.01)

(52) U.S. Cl.
  CPC .......... *H01L 51/5253* (2013.01); *H01L 51/56* (2013.01); *H01L 2251/568* (2013.01); *Y02E 10/549* (2013.01); *Y02P 70/521* (2015.11)

(56) References Cited

U.S. PATENT DOCUMENTS

| | | | |
|---|---|---|---|
| 5,298,311 A * | 3/1994 | Bentson | C04B 35/806 428/212 |
| 5,324,370 A * | 6/1994 | Aoki | B32B 18/00 156/64 |
| 8,243,424 B1 * | 8/2012 | Babu | G06F 1/1601 361/679.01 |
| 2003/0213956 A1 * | 11/2003 | Hioki | G02F 1/133305 257/59 |
| 2005/0073247 A1 * | 4/2005 | Yamazaki | H01L 27/3211 313/503 |
| 2006/0008665 A1 * | 1/2006 | Kotsubo | B32B 7/12 428/520 |
| 2006/0275926 A1 | 12/2006 | Carcia et al. | |
| 2007/0091062 A1 * | 4/2007 | French | G02F 1/133305 345/107 |
| 2008/0163648 A1 * | 7/2008 | Sundholm | B44F 1/06 65/17.2 |
| 2008/0248315 A1 * | 10/2008 | Wiand | B32B 17/10 428/425.3 |
| 2010/0052503 A1 | 3/2010 | Fukagawa | |
| 2010/0119846 A1 * | 5/2010 | Sawada | C03B 33/023 428/426 |
| 2010/0245751 A1 * | 9/2010 | Muneyoshi | G02F 1/133305 349/149 |
| 2013/0095582 A1 * | 4/2013 | Miyairi | H01L 51/5246 438/26 |

FOREIGN PATENT DOCUMENTS

| | | | |
|---|---|---|---|
| DE | 102011079101 A1 | 1/2013 | |
| JP | 07314568 | * 12/1995 | ............ G02B 5/00 |
| JP | 2004079432 A | 3/2004 | |
| WO | 2009/126115 A1 | 10/2009 | |
| WO | 2010/140980 A1 | 12/2010 | |

* cited by examiner

Fig. 7

ELEMENT FOR STABILIZING AN OPTOELECTRONIC DEVICE METHOD FOR PRODUCING AN ELEMENT AND OPTOELECTRONIC DEVICE

An element is provided for stabilising an optoelectronic device. In addition, a method is provided for producing an element for stabilising an optoelectronic device. In addition, an optoelectronic device with an element for stabilising is provided.

One task to be solved is that of providing an element for stabilising an optoelectronic device which is particularly stable and flexible. A further problem addressed by the present application is that of providing a method with which an effective element for stabilising an optoelectronic device may be simply produced. A further problem addressed by the present application is that of providing a stable and long-lived optoelectronic device.

According to one aspect, an element is provided. The element is configured for use in an optoelectronic device, for example in an organic, radiation-emitting device. The element is suitable in particular for mechanical stabilisation of the optoelectronic device. In other words, the element is suitable for imparting mechanical stability to the optoelectronic device, or device for short. The element may for example serve as a carrier for a functional region of the optoelectronic device owing to its stable mechanical properties.

The element comprises a main body. The main body has a lateral main direction of extension which runs parallel to the main plane of extension of the main body. In this context, the term "lateral extent" is introduced, which denotes the extent of the main body or of the element in the lateral main direction of extension. A "vertical direction" is hereinafter a direction perpendicular to the lateral main direction of extension of the main body. A vertical extent of the main body consequently denotes the height or thickness of the main body.

Preferably, the width of the main body amounts to a multiple of the thickness of the main body. For example, the main body has a width in the meter or centimeter range. The main body may for example be processed from a reel. For example, the main body has a thickness of less than or equal to 500 µm, preferably less than or equal to 200 µm, for example 150 µm or 100 µm. For example, the main body has a thickness of less than or equal to 50 µm, for example of 25 µm or of 20 µm.

The main body is radiation-transmissive. In other words, the main body is configured such that electromagnetic radiation, preferably light, may pass through it. The main body may consist of a glass. Alternatively, the main body may comprise at least one glass or consist of a glass-containing material. In addition, the main body may then also comprise a further material, for example a plastics material. For example, the main body may comprise a soda-lime glass (window glass) or a borosilicate glass or consist of one of these glasses.

Due to the small thickness of the main body, the main body is preferably deformable. In other words, the shape of the main body may be modified by the action of external force. In particular, the main body is of flexible or pliable construction. This means in this context that the main body may preferably be bent in the direction perpendicular to its main direction of extension.

The main body comprises a first and a second surface. The first and second surfaces are arranged opposite one another. The first and second surfaces are arranged parallel to one another. The first and second surfaces in each case extend in the lateral main direction of extension of the main body. The first and second surfaces form a top or bottom of the main body, respectively. The first and second surfaces are delimited at both sides of the main body in each case by a side face of the main body.

At least at one of the surfaces of the main body, i.e. at the first and/or the second surface, a protective layer is formed. The protective layer completely covers the respective surface. In other words, the protective layer extends over the entire lateral extent of the surface. The protective layer is preferably arranged permanently on the surface. In other words, the protective layer cannot be straightforwardly removed or detached from the surface. The bond between the main body and the protective layer may be intimate, such that detachment of the protective layer is not possible without damaging or destroying the main body in the process. The at least one protective layer is of one-piece construction. In other words, the protective layer provides a continuous cover over the surface of the main body. The thickness or vertical extent of the protective layer is less than the thickness of the main body. For example, the protective layer has a thickness of less than or equal to 5 µm, for example 500 nm, 100 nm, or 50 nm.

The protective layer comprises an inorganic material. The protective layer may comprise an oxide, in particular a metal oxide or a semiconductor oxide, and/or a nitride, in particular a metal nitride or a semiconductor nitride. The inorganic material may for example comprise or be silicon dioxide ($SiO_2$), silicon nitride (SiN), aluminium dioxide ($Al_2O_3$), aluminium nitride (AlN), titanium dioxide ($TiO_2$), zirconium dioxide ($ZrO_2$) or hafnium dioxide ($HfO_2$). It is moreover possible for the protective layer to comprise a plurality of layers, which may also be formed of different materials. An oxide or an oxide layer and a nitride or a nitride layer are distinguished in particular by their strength. The protective layer is preferably an ALD (atomic layer deposition) protective layer. In other words, the protective layer is preferably formed or deposited on the surface of the main body using an ALD process such as flash ALD, photo-induced ALD or another ALD method, as described in detail in the context of the manufacturing method for the element. A high temperature ALD method may in particular also be used, in which the protective layer is deposited at temperatures of 100° C. or higher.

Due to the material properties and small thickness of the main body, the main body may comprise fine cracks (hairline cracks), which may in particular be formed at the first and/or second surface. These cracks may arise spontaneously, i.e. without external action on the main body, since the main body is not typically in a state of equilibrium. Cracking in the main body may also be triggered by mechanical action during processing of the main body, such as for example bending and/or splitting of the main body, and restricts application of the main body or use of the main body in an optoelectronic device.

The cracks extend at least partially over the thickness of the main body. The cracks may have a negative effect on the service life, the stability and thus the stabilising effect of the main body in relation to an optoelectronic device. Though initially only small or with a small vertical and/or lateral extent, the cracks may spread further through mechanical loading of the main body and pass completely through the main body. In the worst case, the main body may break due to the cracks.

The protective layer is configured and arranged in such a way that the cracks present in the main body are filled in by the material of the protective layer. In particular, the protective layer is arranged and configured in such a way that the material of the protective layer penetrates into the cracks in the surface, in particular extends completely into the cracks and thus completely fills in the cracks. In other words, cracks present in the surface of the main body are sealed using the protective layer.

The protective layer on the surface thus stabilises the main body and prevents existing cracks from spreading further and/or new cracks from arising. In particular, the protective layer fills surface cracks present at the at least one surface in completely. Further spreading and/or propagation of the cracks is prevented effectively thereby. The protective layer thus prevents the main body from breaking due to the fine cracks. Despite the only small thickness of the main body, a very stable element is thus provided which is flexible with regard to use and which is in particular very well suited to reliably stabilising an optoelectronic device and bearing functional layers of the device.

According to at least one embodiment, the main body consists of a glass. The main body may then in particular take the form of a homogeneous solid body. This means that the main body does not have any structure such as for example layers of different composition, but rather the main body is formed of a homogeneous material.

Furthermore, the main body does not take the form of a hollow body, which encloses regions of a different material, but rather the main body is a solid body. The protective layer preferably directly adjoins the main body, without a further material being arranged between the main body and the protective layer. The protective layer has a common boundary surface with the main body and is formed in particular of a different material from the main body.

The protective layer may completely enclose the main body at its outer surface. The main body is then not exposed at any point, but rather is completely surrounded by the protective layer. Only together with the protective layer does the main body form a mechanically self-supporting element, which may for example be further processed. Without the protective layer the main body is then not mechanically self-supporting.

According to at least one embodiment, the protective layer is light-transmitting. In other words, the protective layer is suitable and configured for allowing through light emitted for example by an active zone of the optoelectronic device. The protective layer is clear or transparent.

The light transmittance of the protective layer amounts preferably to at least 75% for visible light. The indicated value for the light transmittance is obtained at least in a sub-range of the visible range of the spectrum (wavelength of around 400 to 800 nm). The value for light transmittance already includes Fresnel losses, which occur when light enters or exits the protective layer. The light transmittance of the protective layer may amount to 80% or more, in particular 85% or more. The light transmittance may even be greater than 90%, for example 95%.

Due to the high light transmittance of the protective layer, virtually no radiation losses occur in the case of visible light. Thus, the element is particularly well suited to stabilising an optoelectronic device which emits or receives light.

The protective layer formed with an oxide may additionally have the property that it as far as possible completely absorbs ultraviolet (UV) radiation which impinges on the protective layer. Preferably, greater than or equal to 50% of the impinging UV radiation, particularly preferably greater than or equal to 75%, for example 85% or 95% of the UV radiation, is absorbed by the protective layer. UV radiation may irreversibly damage an active zone and other layers of an optoelectronic device, in particular organic layers, such that said device remains functional only to a reduced degree or is no longer functional at all. The UV-absorbing properties of a protective layer produced by atomic layer deposition are described for example in the German patent application bearing file number DE 10 2011 079 101.9, the disclosure content of which is hereby included by reference.

According to at least one embodiment, a first protective layer is formed on the first surface and a second protective layer is formed on the second surface. The first and second protective layers are accordingly arranged opposite to one another. The first and second protective layers are arranged parallel to one another. The first and second protective layers may be of mutually identical construction.

Because a protective layer is arranged on each of the surfaces, spontaneous breaking of the main body may be particularly well prevented. Cracks present in the particular surface are effectively filled in by the material of the first or second protective layer respectively. New cracks are prevented from arising. A particularly stable, flexibly usable element is thus made available.

According to at least one embodiment, a first protective layer is formed on the first surface. A protective film is arranged on the second surface. Protective film and protective layer are consequently arranged opposite to one another. Protective film and protective layer are arranged parallel to one another. Protective film and protective layer each extend over the entire lateral extent of the surface.

The protective film for example comprises a laminated plastics material. In other words, the protective film may be fixed to the second surface of the main body using an adhesive. The protective film is preferably of flexible or pliable construction. The protective film preferably has a small thickness. The thickness of the protective film may correspond approximately to the thickness of the protective layer or may be smaller than the thickness of the protective layer. For example, the protective film has a thickness of less than 500 μm or 100 μm or equal to 10 μm. The protective film is of one-piece construction. Preferably, the protective film is arranged only temporarily on the second surface. For example, the protective film may be removed again from the second surface once the protective layer has been applied to the first surface. Preferably, the protective film may be removed from the second surface without leaving a residue, i.e. without residues of the adhesive and/or the protective film remaining on the second surface.

Use of the protective film may prevent the second surface from being wetted with the protective layer. The protective film additionally serves to protect the second surface from external influences. In addition, the protective film serves to prevent damage to the second surface, for example scratching of the second surface, during handling and/or machining of the element.

According to at least one embodiment, the surface of the protective film remote from the main body is covered with the second protective layer. In this case, the protective film may remain in the element. The protective film may then in turn be covered by the second protective layer. This may then also serve as chemical protection of the protective film.

According to at least one embodiment, the element comprises a transparent conductive layer. The transparent conductive layer is arranged on the protective layer on the side remote from the main body. The transparent conductive layer is arranged on a surface of the protective layer which is remote from the surface of the main body. Alternatively, the transparent conductive layer may also be arranged on a surface of the main body on which no protective layer or no protective film is arranged. In other words, the transparent conductive layer may also be arranged directly on the first or the second surface of the main body. In this case, the main body comprises just one protective layer, which is arranged on the other surface of the main body.

The transparent conductive layer extends at least partially over the surface of the protective layer. Preferably, the transparent conductive layer extends on the protective layer over the entire lateral extent of the main body.

The transparent conductive layer may comprise an electrically conductive oxide (Transparent Conductive oxide, TCO), such as for example indium-tin oxide (ITO) and/or a thin metal layer. For example, the transparent conductive layer has a thickness of less than or equal to 1 µm, for example 0.1 µm, 0.05 µm or 0.01 µm. Preferably, the thickness of the layer is less than 0.01 µm, for example 0.005 µm.

The transparent conductive layer serves to conduct electrical current from the active zone out of the optoelectronic device or from outside to the active zone, once the optoelectronic device has been finished, in particular once the element has been arranged on a functional region, as described in detail below.

According to a further aspect, a method for producing an element for stabilising an optoelectronic device is provided. The element produced thereby preferably corresponds to the element described with reference to the first aspect. All the features disclosed for this element are accordingly also disclosed for the method and vice versa. The method comprises the following steps:

In a first step a main body is provided. The main body preferably corresponds to the above-described main body. The main body comprises the first and second surfaces. Cracks may be present in the main body which start from the first and/or second surface and pass vertically at least part way through the main body.

In a further step, the protective layer is applied to at least one of the surfaces of the main body. The protective layer is applied in a cyclic gas phase deposition process. The protective layer is applied in particular by means of atomic layer deposition.

During the atomic layer deposition, the protective layer is deposited on the entire first and/or second surface of the main body. During the atomic layer deposition, a one-piece or cohesive protective layer arises. The protective layer is bonded inseparably to the respective surface of the main body.

During the atomic layer deposition, the surface on which the protective layer is to be deposited, i.e. the first and/or the second surface, is introduced into a volume. At least one first gaseous starting material, for example trimethylaluminium (TMAT, $C_3H_9Al$) or tantalum pentachloride ($TaCl_5$) is fed into the volume, such that the first gaseous starting material is adsorbed on the surface to be coated.

After preferably complete or virtually complete coverage of the surface to be coated of the main body with the first starting material, the fraction of the first starting material which is still gaseous or has not been adsorbed on the surface is as a rule removed again from the volume. Then a second starting material, for example water or ozone, is supplied. The second starting material is provided to react chemically with the first starting compound adsorbed on the surface, forming the protective layer. A bonding material between the protective layer and the surface is not required.

The protective layer is configured and arranged to prevent spontaneous breaking of the main body and thus to stabilise the main body. The protective layer is in particular not merely deposited on the first and/or second surface of the main body by the ALD method. Rather, the ALD method also introduces material of the protective layer into the cracks present in the main body. In particular, the material of the protective layer fits snugly in unevennesses and cracks at the surface of the main body. This means that the surface becomes completely covered. In addition, undercuts or concave surfaces may also be coated, filled in and/or closed. The material of the protective layer forms the cracks. The material of the protective layer fills in the cracks in the main body in particular partly or completely. In particular, the material of the protective layer extends into the cracks. The protective layer effectively prevents the cracks from spreading and new cracks from arising.

Formation of the protective layer results in a simple manner and in particular in a single method step in particularly efficient stabilisation of the main body. In other words, the method produces a very stable element comprising the main body and the at least one protective layer. The element serves to stabilise an optoelectronic device effectively. Further method steps are not required for this purpose. The method is consequently particularly simple, time-saving and inexpensive.

According to at least one embodiment of the method, a first protective layer is applied to the first surface and a second protective layer is applied to the second surface. Any cracks present in the surface may thus be filled in and the main body may be effectively protected from breakage.

Alternatively, firstly a protective film is applied at least temporarily, in other words removably or non-permanently, to the second surface. The protective film comprises a laminated plastics film. The protective film is configured to prevent damage by scratches to the second surface and/or a wetting of the second surface with the protective layer. Next, the above-described protective layer is then applied to the first surface by atomic layer deposition. The protective film may then be removed again. Alternatively, the protective film may however also remain on the second surface until the element is connected to a functional region to form the optoelectronic device.

According to at least one embodiment of the method, in a further step a transparent conductive layer is applied to the protective layer. Alternatively, the transparent conductive layer may however also be applied instead of the protective film to the second surface of the main body. The transparent conductive layer comprises an electrically conductive oxide or a thin metal layer.

According to a further aspect, an optoelectronic device, device for short, is provided. The device comprises at least one stabilising element. This element preferably corresponds to the element described with reference to the first aspect. All the features disclosed for this element are accordingly also disclosed for the optoelectronic device and vice versa. The element in particular comprises the above-described main body and the at least one protective layer.

The device further comprises at least one functional region. The functional region comprises at least one active zone, which is suitable for generating or detecting electromagnetic radiation, preferably light, or for converting electromagnetic radiation, preferably light, into electrical current. Preferably, the functional region or the active zone comprises an organic material.

The element is mounted, for example adhesively bonded to the functional region. The element is in particular arranged in the beam path of the functional region. Since the element is radiation-transmissive, it is particularly well suited to being arranged on the functional region of the device.

Because the protective layer of the element absorbs UV radiation, successive layers of the functional region in the beam path are effectively protected against UV radiation impinging from outside. Thus, the service life of the optoelectronic device is increased and/or a longer-lasting high efficiency is achieved for the device.

The element serves for mechanical stabilisation of the device or of the functional region. The element may for example serve as a carrier for the functional region owing to its stable mechanical properties. This results in a very stable, long-lived device.

The element also serves to protect the device and in particular the functional region from external influences, for example from penetration of water or oxygen into the functional region. In this way, the service life of the device is further increased.

Owing to the very small thickness of the element within the range from around 20 μm to around 500 μm, for example 50 μm, the element contributes only insignificantly to the thickness or vertical extent of the optoelectronic device. The resultant device consequently itself has only a small thickness. Preferably, the device itself has a thickness or vertical extent of between 500 μm and 20 μm, for example 200 μm, 100 μm or 50 μm. Due to the small thickness of the device, the device is deformable and/or flexible and has only a very low weight. The device is therefore particularly flexible and/or usable for extremely different applications.

According to at least one embodiment of the optoelectronic device, said device comprises a second element. The second element is arranged on a surface of the functional region remote from the first element. In other words, the functional region is encapsulated by two elements or embedded in two elements. This results in a particularly stable, long-lived device. At a surface of the second element remote from the functional region, the second element may also comprise the above-described protective film for example instead of the protective layer.

According to at least one embodiment of the optoelectronic device, the at least one functional region comprises an organic light-emitting diode (OLED). In this case, the at least one organic active zone takes the form of an organic electroluminescent layer. The functional region may in this case comprise an organic layer stack, which comprises further layers, such as for example hole-injecting, hole-transporting, electron-injecting and/or electron-transporting layers, wherein layers may also adopt a plurality of functions. The device is in this case particularly well suited to the backlighting of screens (for example of a television or computer monitor) or (AMOLED) displays. Alternatively, the device may in this case however also be used for room lighting. Owing to the material properties, one conceivable use is as a flexible screen and/or as electronic paper, for example for electronic books.

In addition or alternatively, the at least one functional region may comprise an organic light-emitting cell (OLEC). For example, one or more devices may be used in a LEC film for room lighting, for which purpose the device is particularly well suited due to its flexibility.

In addition or alternatively, the at least one functional region may comprise an organic solar cell. In other words, the device may be designed to receive radiation. In this case, the organic layer stack or the at least one active zone may be configured to convert radiation into electrical charges. Because the protective film of the stabilising element absorbs UV light, which is particularly harmful to a solar cell, the device is very well suited to such use. The device may for example be used as a power source for mobile minicomputers or mobile phones.

In addition or alternatively, the at least one functional region may comprise an organic photodiode. In this case the device may for example be used as a sensor in digital cameras or mobile phones.

The element, the method and the device are explained in greater detail below with reference to exemplary embodiments and the associated figures.

Identical, similar or identically acting components are provided with identical reference numerals in the figures. The figures and the size ratios of the components illustrated in the figures relative to one another are not to be regarded as being to scale. Rather, individual components may be illustrated on an exaggeratedly large scale for greater ease of depiction and/or better comprehension.

Figure 1:
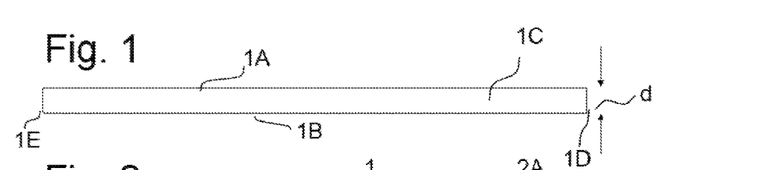
FIG. 1 shows a cross-section of a main body for an element for stabilising an optoelectronic device.

FIG. 1 shows a main body 1C. The main body 1C is part of an element 1 (see FIG. 2), which is suitable for stabilising an optoelectronic device 7, for example an organic radiation-emitting device, as described in detail below. The element 1 is in particular provided for application to a functional region 6 of the device 7 (see FIG. 6).

The main body 1C comprises a first and a second surface 1A, 1B, which lie opposite to one another and extend in each case in the lateral main direction of extension of the main body 1C. The main body comprises two side faces 1D, 1E, which delimit the first and second surfaces 1A, 1B and extend perpendicular to the lateral main direction of extension of the main body 1C.

The main body 1C has a very small thickness d. In particular, the main body 1C is ultrathin. The thickness d of the main body lies between 500 μm and 20 μm. The main body 1C is pliable or flexible.

The main body 1C is radiation-transmissive. The main body 1C consists of a glass. Alternatively, the main body 1C may comprise at least one glass. In other words, the main body 1C may comprise a further material in addition to the glass, for example plastics material.

Figure 3:
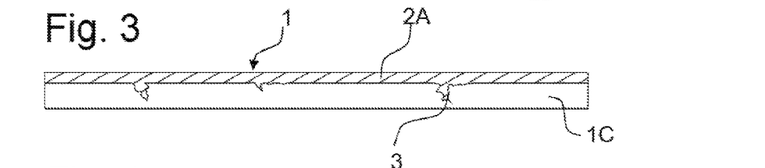
FIG. 3 shows a cross-section of an element for stabilising an optoelectronic device according to a second exemplary embodiment.
Figure 4:
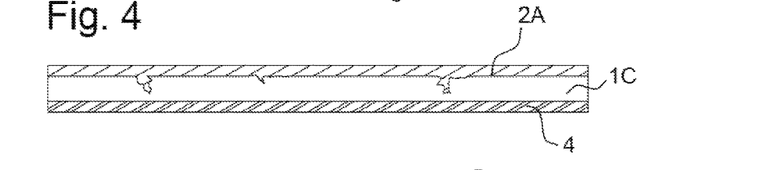
FIG. 4 shows a cross-section of an element for stabilising an optoelectronic device accrding to a third exemplary embodiment.

Owing to the material and small thickness d of the main body 1C, the main body 1C and in particular the first and second surfaces 1A, 1B may comprise cracks 3 (see FIGS. 3 and 4). The cracks 3 may arise for example through mechanical loading of the main body 1C, for example on bending or separation of the main body 1C. The cracks 3 may however also arise spontaneously, i.e. without external action on the main body 1C. The cracks 3 extend at least partially over the vertical extent or thickness d of the main body 1C. The cracks 3 may also propagate at least partially in the lateral direction through the main body 1C.

The cracks 3 impair the stability and service life of the main body 1C. To stabilise the main body 1C, a protective layer 2A, 2B is deposited on at least one of surfaces 1A, 1B using an ALD method (see FIGS. 2 to 6). The protective layer 2A, 2B is in other words an ALD protective layer.

Figure 2:
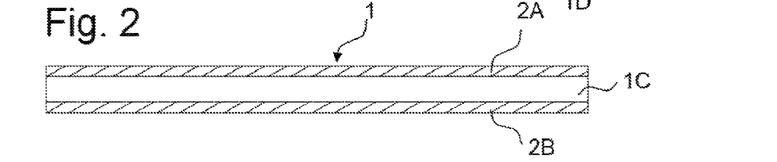
FIG. 2 shows a cross-section of an element for stabilising an optoelectronic device according to a first exemplary embodiment.

FIG. 2 shows a cross-section of an element 1 for stabilising an optoelectronic device according to a first exemplary embodiment.

In this exemplary embodiment a first protective layer 2A is applied to the first surface 1A and a second protective layer 2B is applied to the second surface 1B. The protective layer 2A, 2B completely covers the respective surface 1A, 1B and extends in particular over the entire lateral extent of the surface 1A, 1B. Other than is shown in the figure, the protective layer 2A, 2B may also cover the side faces 1D, 1E of the main body 1C. The protective layer 2A, 2B is of one-piece construction and arranged permanently on the surface 1A, 1B, i.e. bonded firmly to the surface 1A, 1B.

The thickness of the first and second protective layers 2A, 2B is in each case less than the thickness d of the main body 1C. For example, the respective protective layer 2A, 2B has a thickness of at most 5 µm, for example at most 500 nm, at most 100 nm, or at most 50 nm. In particular each protective layer 2A, 2B makes only a small contribution to the thickness d of the main body 1C. The protective layer 2A, 2B is light-transmitting. On the other hand, the protective layer 2A, 2B may absorb UV radiation. The protective layer 2A, 2B for example comprises an oxide and/or a nitride.

The protective layer 2A, 2B not only covers the surfaces 1A, 1B, but also completely fills in the cracks 3 in the main body 1C or in the surfaces 1A, 1B (see in this respect FIGS. 3 and 4). The material of the protective layer 2A, 2B penetrates completely into the cracks 3 in particular during the ALD process. In other words, the protective layer 2A, 2B adapts in optimum manner to the contours of the respective surface 1A, 1B. Cracks 3 or notches, indentations and/or holes on or in the respective surface 1A, 1B are optimally compensated or filled in by the protective layer 2A, 2B. In this way the stability of the main body 1C is increased and further growth of the cracks 3 is prevented. The likelihood of spontaneous breakage of the main body 1C and/or of breakage due to mechanical loading may thus be prevented.

FIG. 3 shows a cross-section of an element 1 for stabilising an optoelectronic device according to a second exemplary embodiment. With respect to the general features of the protective layer 2A, 2B and of the main body 1C, extensive reference is made to the description of FIGS. 1 and 2.

In contrast to the element 1 shown in FIG. 2, in this exemplary embodiment only a first protective layer 2A is applied to the first surface 1A. The second surface 1B does not comprise any protective layer, in particular is free of a protective layer. The second surface 1B may in this case serve for example as a mounting face for application of the functional region 6 (see for example FIG. 6).

FIG. 4 shows a cross-section of an element 1 for stabilising an optoelectronic device according to a third exemplary embodiment. With respect to the general features of the protective layer 2A, 2B and of the main body 1C, extensive reference is made to the description of FIGS. 1 and 2.

In contrast to the element 1 shown in FIG. 2, in this exemplary embodiment only a first protective layer 2A is applied to the first surface 1A. The second surface 1B is free of a protective layer. A protective film 4 is applied, for example adhesively bonded, to the second surface 1B. The protective film 4 and the protective layer 2A arranged on the first surface 1A are arranged parallel to one another and extend in each case over the entire lateral extent of the main body 1C.

The protective film 4 comprises a laminated plastics material. The thickness of the protective film 4 here corresponds to the thickness of the proective layer 2A. However, the protective film 4 may also have a larger or smaller thickness than the protective layer 2A. The thickness of the protective film 4 is preferably less than or equal to 500 µm, 100 µm or less than or equal to 10 µm.

Figure 7:
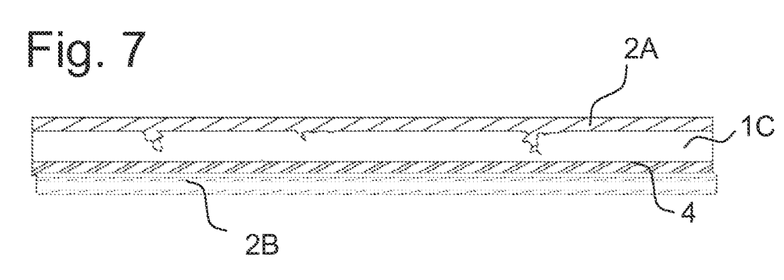
FIG. 7 shows a cross-section of an element for stabilising an optoelectronic device according to a further exemplary embodiment.

Like the protective layer 2A, the protective film 4 is of one-piece construction. In contrast to the protective layer 2A formed on the first surface 1A, the protective film 4 is arranged permanently or only temporarily on the second surface 1B. In particular, the protective film 4 may be removed again from the second surface 1B, for example once the protective layer 2A has been applied to the first surface 1A. Alternatively, the protective film may remain permanently on the main body 1C and is coated with the second protective layer 2B. This is shown in FIG. 7. The protective layer may here also serve as chemical protection for the material of the protective film.

The protective film 4 or a material of the protective film 4 does not penetrate into cracks present at the second surface 1B or does not fill in these cracks (not shown explicitly). Instead, the protective film 4 is merely arranged on the second surface 1B itself, without penetrating into the main body 1C.

The protective film 4 serves to prevent wetting of the second surface 1B with the material of the protective layer 2A and/or to protect the second surface 1B from external influences. In addition, the protective film 4 may stabilise the element 1 mechanically.

Figure 5:
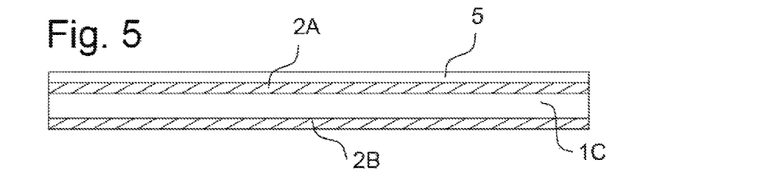
FIG. 5 shows a cross-section of an element for stabilising an optoelectronic device according to a further exemplary embodiment.

FIG. 5 shows a cross-section of an element 1 for stabilising an optoelectronic device according to a further exemplary embodiment. With respect to the general features of the protective layer 2A, 2B and of the main body 1C, extensive reference is made to the description of FIGS. 1 and 2.

As with the element 1 shown in FIG. 2, in this exemplary embodiment the first protective layer 2A is applied to the first surface 1A and the second protective layer 2B is applied to the second surface 1B. A transparent conductive layer 5 is arranged on the first protective layer 2A and in particular on a surface of the first protective layer 2A which is remote from the main body 1C. The transparent conductive layer 5 extends over the entire surface of the first protective layer 2A.

In an alternative exemplary embodiment (not shown explicitly), a transparent conductive layer 5 may also be applied to the second protective layer 2B, provided a second protective layer 2B is present. In an alternative exemplary embodiment (not shown explicitly), the layer 5 may also be applied directly to the first or the second surface 1A, 1B, without a protective layer 2A, 2B having been previously applied to the surface 1A, 1B.

In this exemplary embodiment, the transparent conductive layer 5 comprises an electrically conductive oxide (TCO). Alternatively, the transparent conductive layer 5 may however also comprise a metal layer. The thickness of the layer 5 here corresponds to the thickness of the first protective layer 2A. However, the layer 5 may also have a larger or smaller thickness than the first protective layer 2A.

The transparent conductive layer 5 serves to conduct radiation away from the previously mentioned functional region 6 or from outside to the functional region 6, once the element 1 has been arranged on the functional region 6.

Figure 6:
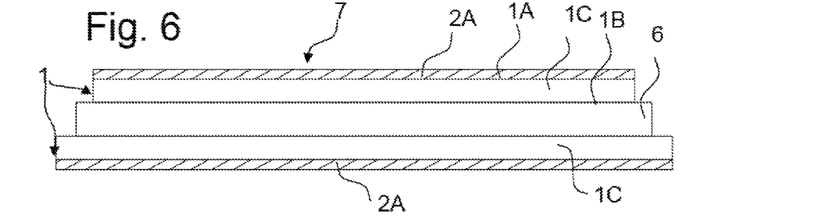
FIG. 6 shows a cross-section of an optoelectronic device.

FIG. 6 shows a cross-section of an optoelectronic device 7.

The device 7 comprises the functional region 6. The functional region 6 may comprise an organic light-emitting cell, an organic solar cell, an organic light-emitting diode, and/or an organic photodiode. In other words, the device 7 may be of radiation-emitting and/or radiation-receiving construction.

The device 1 further comprises two elements 1. The functional region 6 and the elements 1 together form the device 7.

A first element 1 is arranged, for example adhesively bonded or deposited, in the emit or receive direction of the functional region 6 on a first surface of the functional region 6. In this exemplary embodiment, the first element 1 comprises the main body 1C and the first protective layer 2A arranged on the first surface 1A. In particular, the first protective layer 2A is arranged on a surface of the main body 1C which is remote from the functional region 6.

Alternatively (not shown explicitly), the element 1 may have the second protective layer 2B (see FIG. 2) or the protective film 4 (see FIG. 4) on the second surface 1B (here therefore the surface facing the functional region 6). Alternatively or in addition (not shown explicitly), the element 1 on the first surface 1A may also further comprise the transparent conductive layer 5 (see FIG. 5).

A further element 1 is arranged on a second surface of the functional region 6. In particular, this further element 1 is arranged on a surface of the functional region 6 remote from the first element 1. In this exemplary embodiment, the further element 1 comprises the main body 1C and the first protective layer 2A arranged on the first surface 1A. Also in the case of the further element 1 the first protective layer 2A is arranged on a surface of the main body 1C which is remote from the functional region 6. Alternatively (not shown explicitly), the further element 1 may also have the second protective layer 2B (see FIG. 2) or the protective film 4 (see FIG. 4) on the second surface 1B (here therefore the surface facing the functional region 6).

The functional region 6 is encapsulated by the first element 1 and the further element 1 or surrounded by the elements 1. The elements 1 serve for mechanical stabilisation of the functional region 6. The elements 1 serve in particular as a result of their stable mechanical properties as a carrier for the functional region 6. The elements 1 further serve to protect the device and in particular the functional region 6 from external influences, for example from the penetration of water or oxygen into the functional region 6.

In an alternative exemplary embodiment (not shown explicitly), it is however also possible for just one element 1 to be arranged on the functional region 6. This element 1 is then preferably arranged in the emission direction on the functional region 6. In this case a carrier substrate may be provided on the surface of the functional region 6 remote from the element 1.

The element 1 and the optoelectronic device 7 are produced as follows.

In a first step the above-described main body 1C is provided. In a further step the protective layer 2A, 2B is applied according to one of the exemplary embodiments shown in FIG. 2 or 3 to at least one of the surfaces 1A, 1B of the main body 1C by means of atomic layer deposition. In other words, either just one protective layer 2A is applied to the first surface 1A (FIG. 3) or a protective layer 2A, 2B is applied to each of surfaces 1A, 1B (FIG. 2). In this step the material of the protective layer penetrates into the cracks 3 in the main body 1C and envelops these in conforming manner or fills them in partly or completely.

If only the first protective layer 2A is applied to the first surface 1A, the protective film 4 may be arranged on the second surface 1B in an optional step prior to the deposition step.

In an optional step, after the deposition process the transparent conductive layer 5 is further applied to the first protective layer 2A. In a further optional step the protective film 4 is then removed again from the second surface 1B.

In a next step the functional region 6 is provided. Depending on the desired configuration of the device 7, an element 1 is then applied, for example adhesively bonded, to the functional region 6 for stabilisation. Element 1 and functional region 6 together form the optoelectronic device 7. The device 7 is flexible or deformable owing to its very small thickness and its material.

A further element 1 may optionally be arranged and fixed, for example adhesively bonded, on a surface of the functional region 6 remote from the first element 1.

This patent application claims priority from German patent application 102012220586.1, whose disclosure content is hereby included by reference.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An element for stabilizing an optoelectronic device comprising:
   a main body, which consists of a glass or at least comprises a glass, wherein the main body comprises a first and a second surface,
   wherein the first and the second surface lie opposite to one another and extend in each case in a lateral main direction of extension of the element,
   wherein a protective layer is fored at least at one of the surfaces,
   wherein the protective layer is configured and arranged in such a way that cracks present in the main body are at least partly filled in by a material of the protective layer,
   wherein the protective layer comprises a metal oxide or a metal nitride, and
   wherein a protective film is arranged on the second surface, and the surface of the protective film remote from the main body is covered with a second protective layer.

2. The element according to claim 1, wherein the main body consists of the glass,
   wherein the main body is a homogeneously formed solid body, and
   wherein the protective layer directly adjoins the glass.

3. The element according to claim 1, wherein the main body has a thickness (d) of less than or equal to 500 μm.

4. The element according to claim 1, wherein the protective layer is light-transmitting.

5. The element according to claim 1, wherein a first protective layer is formed on the first surface, and
   wherein a second protective layer is formed on the second surface.

6. The element according to claim 1, wherein a first protective layer is formed on the first surface,
   and wherein the protective film comprises a laminated plastics material.

7. The element according to claim 1, wherein the at least one protective layer at least partly fills in the cracks in the main body,
wherein the protective layer completely covers the first surface and/or the second surface of the main body,
wherein the material of the protective layer extends into the cracks, and
wherein the at least one protective layer is of one-piece construction.

8. The element according to claim 1, further comprising:
a transparent conductive layer, wherein the transparent conductive layer is arranged on the protective layer, and
wherein the transparent conductive layer comprises an electrically conductive oxide or a thin metal layer.

9. A method for producing an element for stabilizing an optoelectronic device, the element comprising a main body, which consists of a glass or at least comprises a glass,
wherein the main body comprises a first and a second surface,
wherein the first and the second surface lie opposite to one another and extend in each case in a lateral main direction of extension of the element,
wherein a protective layer is formed at least at one of the surfaces, and
wherein the protective layer is configured and arranged in such a way that cracks present in the main body are at least partly filled in by a material of the protective layer, the method comprising the following steps:
providing the main body; and
applying the protective layer to at least one of the surfaces of the main body,
wherein the protective layer is applied by means of atomic layer deposition.

10. The method according to claim 9, wherein the protective layer is configured and arranged to prevent spontaneous breaking of the main body and thus to stabilize the main body, and
wherein on application of the protective layer cracks present in the main body are filled in by the material of the protective layer.

11. The method according to claim 9, wherein a first protective layer is applied to the first surface, and
wherein a second protective layer is applied to the second surface, or firstly a protective film is applied at least temporarily to the second surface and then the protective layer is applied to the first surface.

12. The method according to claim 11, wherein the protective film comprises a laminated plastics film,
wherein the protective film is configured to prevent damage by scratches to the second surface, and/or
wherein the protective film is configured to prevent wetting of the second surface with the protective layer.

13. The method according to claim 9, comprising the further step:
applying a transparent conductive layer to the protective layer,
wherein the transparent conductive layer comprises an electrically conductive oxide or a thin metal layer.

14. An optoelectronic device comprising:
at least one functional region, wherein the functional region comprises at least one organic material; and
at least one element for stabilizing an optoelectronic device having a main body, which consists of a glass or at least comprises a glass,
wherein the main body comprises a first and a second surface,
wherein the first and the second surface lie opposite to one another and extend in each case in a lateral main direction of extension of the element,
wherein a protective layer is formed at least at one of the surfaces,
wherein the protective layer is configured and arranged in such a way that cracks present in the main body are at least partly filled in by a material of the protective layer, and
wherein the functional region is arranged on the element.

15. The optoelectronic device according to claim 14, comprising:
a second element for stabilizing an optoelectronic device, the second element comprising a main body, which consists of a glass or at least comprises a glass,
wherein the main body comprises a first and a second surface,
wherein the first and the second surface lie opposite to one another and extend in each case in a lateral main direction of extension of the second element,
wherein a protective layer is formed at least at one of the surfaces,
wherein the protective layer is configured and arranged in such a way that cracks present in the main body are at least partly filled in by a material of the protective layer,
wherein the second element is arranged on a surface of the functional region remote from the element.

16. The optoelectronic device according to claim 14, wherein the device is flexible, and
wherein the at least one functional region comprises at least one of the following components:
an organic light-emitting cell,
an organic solar cell,
an organic light-emitting diode, or
an organic photodiode.

17. The method according to claim 9, wherein a first protective layer is formed on the first surface,
wherein a protective film is arranged on the second surface,
wherein the protective film comprises a laminated plastics material, and
wherein the surface of the protective film remote from the main body is covered with a second protective layer.

18. An element for stabilizing an optoelectronic device comprising:
a main body, which consists of a glass or at least comprises a glass, wherein the main body comprises a first and a second surface,
wherein the first and the second surface lie opposite to one another and extend in each case in a lateral main direction of extension of the element,
wherein a protective layer is formed at least at one of the surfaces,
wherein the protective layer is configured and arranged in such a way that cracks present in the main body are at least partly filled in by a material of the protective layer,
wherein a first protective layer is formed on the first surface,
wherein a protective film is arranged on the second surface,
wherein the protective film comprises a laminated plastics material, and wherein a surface of the protective film remote from the main body is covered with a second protective layer.

* * * * *

UNITED STATES PATENT AND TRADEMARK OFFICE
CERTIFICATE OF CORRECTION

PATENT NO. : 10,043,988 B2
APPLICATION NO. : 14/442397
DATED : August 7, 2018
INVENTOR(S) : Richard Baisl et al.

Page 1 of 1

It is certified that error appears in the above-identified patent and that said Letters Patent is hereby corrected as shown below:

In the Claims

In Column 12, Line 41:
Replace "...a protective layer is fored..." with "...a protective layer is formed...".

Signed and Sealed this
Nineteenth Day of March, 2019

Andrei Iancu
*Director of the United States Patent and Trademark Office*